United States Patent
Tsao et al.

(10) Patent No.: US 7,368,379 B2
(45) Date of Patent: May 6, 2008

(54) MULTI-LAYER INTERCONNECT STRUCTURE FOR SEMICONDUCTOR DEVICES

(75) Inventors: Jung-Chih Tsao, Taipei (TW); Kei-Wei Chen, Taipei (TW); Yu-Ku Lin, Hsin Chu (TW); Chyi S Chern, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 178 days.

(21) Appl. No.: 11/197,009

(22) Filed: Aug. 4, 2005

(65) Prior Publication Data

US 2007/0034517 A1    Feb. 15, 2007

(51) Int. Cl.
*H01L 21/3205* (2006.01)

(52) U.S. Cl. ............ 438/652; 438/641; 438/625; 257/762; 257/E21.586

(58) Field of Classification Search .......... 438/763, 438/629, 625, 641, 652
See application file for complete search history.

(56) References Cited

U.S. PATENT DOCUMENTS 4,620,986 A * 11/1986 Yau et al. ............... 438/763
6,340,633 B1 * 1/2002 Lopatin et al. ............ 438/625
6,368,965 B1 * 4/2002 Lopatin .................... 438/676
2004/0229456 A1 * 11/2004 Andricacos et al. ....... 438/642
2006/0121725 A1 * 6/2006 Basol et al. ............... 438/626

* cited by examiner

*Primary Examiner*—Asok K. Sarkar
*Assistant Examiner*—Emily Rohm
(74) *Attorney, Agent, or Firm*—Slater & Matsil, L.L.P.

(57) ABSTRACT

An interconnect structure for a semiconductor device and its method of manufacture is provided. The interconnect structure includes a multi-layer structure having one or more stress-relief layers. In an embodiment, stress-relief layers are positioned between layers of electroplated copper or other conductive material. The stress-relief layer counteracts stress induced by the conductive material and helps prevent or reduce a pull-back void. For an interconnect structure using electroplated copper, the stress-relief layer may be formed by temporarily reducing the electroplating current, thereby causing a thin film of copper having a larger grain size to be formed between other layers of copper. The larger grain size typically exhibits more of a compressive stress than copper with a smaller grain size. The stress relief layer may also be formed of other materials, such as SIP-Cu, Ta, SiC, or the like.

20 Claims, 4 Drawing Sheets

MULTI-LAYER INTERCONNECT STRUCTURE FOR SEMICONDUCTOR DEVICES

TECHNICAL FIELD

This invention relates generally to semiconductor devices and, more particularly, to an interconnect structure electrically coupling two or more conductive layers in a semiconductor device.

BACKGROUND

In modern integrated circuits, minimum feature sizes, such as the channel length of field effect transistors, have reached the deep sub-micron range, thereby steadily increasing performance of these circuits in terms of speed and power consumption. As the size of the individual circuit elements is reduced, so is the available real estate for conductive interconnects in integrated circuits. Consequently, these interconnects have to be reduced to compensate for a reduced amount of available real estate and for an increased number of circuit elements provided per chip.

Generally, integrated circuits (ICs) comprise electronic components, such as transistors, capacitors, or the like, formed on a substrate. One or more metal layers are then formed over the electronic components to provide connections between the electronic components and to provide connections to external devices. The metal layers typically comprise an inter-layer dielectric (ILD) layer in which vias and interconnects are formed, usually with a single- or dual-damascene process.

As mentioned above, the trend in the semiconductor industry is towards the miniaturization or scaling of integrated circuits, in order to provide smaller ICs and improve performance, such as increased speed and decreased power consumption. While aluminum and aluminum alloys were most frequently used in the past for the material of conductive lines in integrated circuits, the current trend is to use copper for a conductive material because copper has better electrical characteristics than aluminum, such as decreased resistance, higher conductivity, and a higher melting point.

The change in the conductive line material and insulating materials of semiconductor devices has introduced new challenges in the manufacturing process. FIG. 1 illustrates a portion of a wafer 100 having an ideal interconnect structure. Generally, the wafer 100 comprises a substrate 110, which may have electronic components such as transistors, capacitors, or the like formed thereon, or may comprise a metallization layer. An etch stop layer 112 is formed on the substrate 110, and a dielectric layer 114 is formed on the etch stop layer 112. A trench 116 and via 118 are formed through the dielectric layer 114 and the etch stop layer 112. The trench 116 and the via 118 are typically lined with a barrier/adhesion layer 120 (such as tantalum nitride) and then filled with a conductive material (such as copper).

FIG. 2 illustrates a common problem that may occur with an interconnect structure such as that illustrated in FIG. 1. In particular, the conductive material used to fill the trench 116 and the via 118 may exert a tensile stress, causing the conductive material to pullback from the bottom of the via and creating a pullback void 210. The pullback void 210 may increase the contact resistance between the interconnect structure and the underlying electrical component, or even cause the device to fail. This is particularly a problem when using copper as the conductive material to fill the trench 116 and the via 118.

Accordingly, there is a need for an interconnect structure that allows for the use of a low resistance material, such as copper, and prevents or reduces the pullback void.

SUMMARY OF THE INVENTION

These and other problems are generally solved or circumvented, and technical advantages are generally achieved, by preferred embodiments of the present invention, in which improved structures and methods relating to interconnect structures is provided.

In an embodiment, a semiconductor device comprises a substrate and a dielectric layer formed thereon. At least one opening, e.g., a via or trench, is formed in the dielectric layer. A plurality of conductive layers are formed having at least one stress-relief layer formed between two of the plurality of conductive layers. A barrier/adhesion layer may be formed between the dielectric layer and the conductive layers.

The stress-relief layer counteracts the stress induced by the conductive layers. For example, if the conductive layers comprise copper layers that exert a tensile stress, then the stress-relief layer preferably exerts a compressive stress.

In an embodiment, the conductive layers comprise electroplated copper. In this embodiment, the stress-relief layer may be formed by reducing the current such that a copper layer having a larger grain size is formed. In a preferred embodiment, the current is reduced to less than 40 mA/cm$^2$.

In an alternative embodiment, the stress-relief layer may comprise another material, such as SIP-Cu, Ta, SiC, or the like.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

This invention relates generally to an interconnect structure that prevents or reduces a pullback void that often occurs in semiconductor devices. While the present invention is described in the context of copper interconnects and metallization layers, embodiments of the present invention may be used to fabricate interconnect structures or other semiconductor device structures in which the pullback void may occur. Embodiments of the present invention may also be useful in interconnect structures or other semiconductor device structures in which the difference in the physical characteristics (e.g., stress, expansion, contraction, or the like) between materials may cause voids or other undesirable structural/electrical characteristics. It is further believed that embodiments described herein will benefit other integrated circuit interconnection applications not specifically mentioned. Therefore, the specific embodiments discussed are merely illustrative of specific ways to make and use the invention, and do not limit the scope of the invention.

Figure 1:
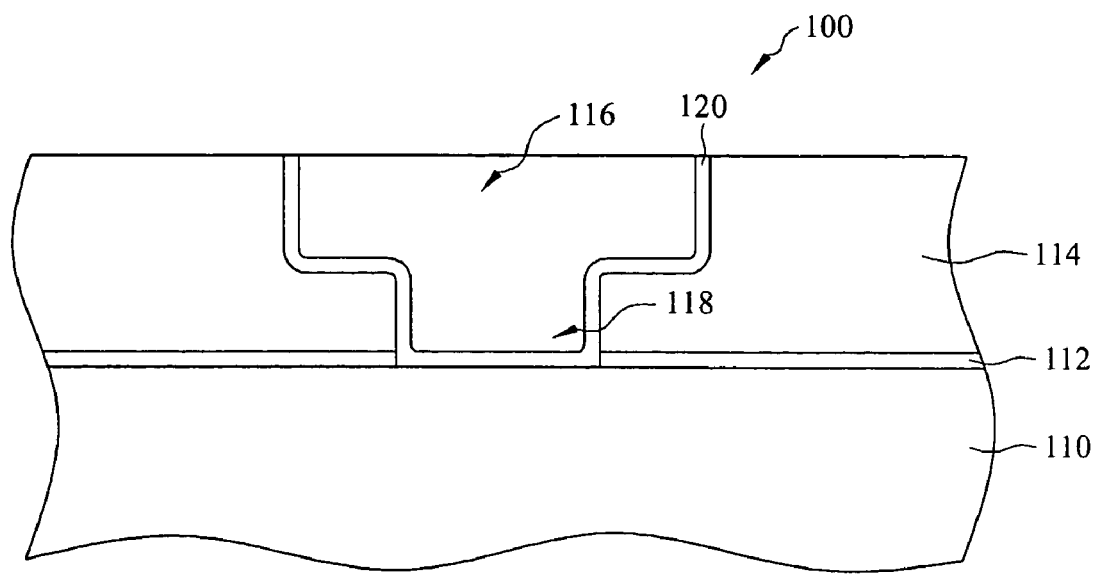
FIG. 1 is a cross-sectional view of a wafer illustrating an ideal interconnect structure.
Figure 2:
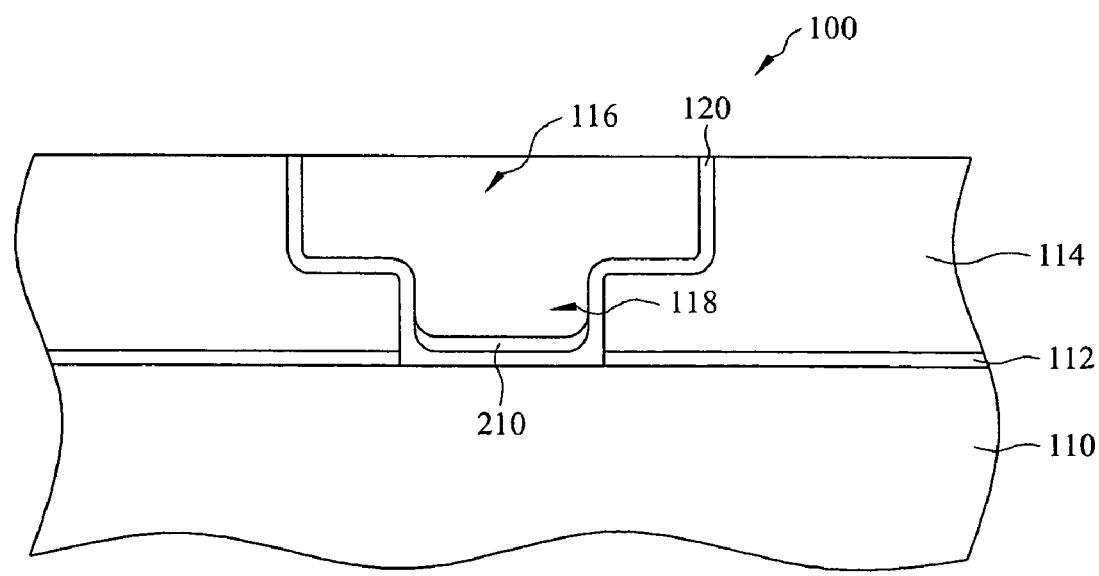
FIG. 2 is a cross-sectional view of a wafer illustrating a pullback void.
Figure 3:
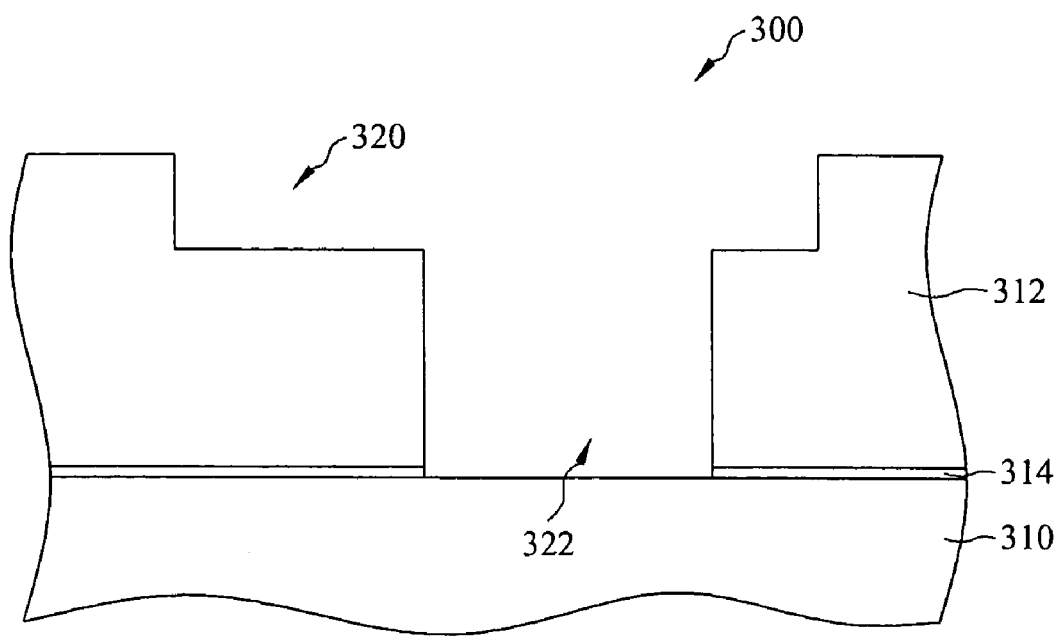
FIGS. 3-6 are cross-sectional views of a wafer illustrating a method of forming an interconnect structure in accordance with an embodiment of the present invention.

FIGS. 3-6 illustrate cross-section views of an embodiment of the present invention in which a multi-layer interconnect structure is formed. Referring first to FIG. 3, a workpiece 300 is provided. The workpiece 300 comprises a semiconductor substrate 310 having a dielectric layer 312 formed thereon. In an embodiment, the substrate 310 comprises a bulk silicon substrate, but other materials, such as germanium, silicon-germanium alloy, or the like, could alternatively be used for the substrate 310. Additionally, the substrate 310 may be a semiconductor-on-insulator (SOI) substrate, a silicon-on-sapphire substrate (SOS), or a multi-layered structure, such as a silicon-germanium layer formed on a bulk silicon layer, or the like. Other materials may be used. Furthermore, the substrate 310 may include other active components or circuits (not shown), dielectric layers (not shown) and metallization layers (not shown), or the like.

The dielectric layer 312 may comprise dielectric materials, preferably having a dielectric constant (K) of about 4.0 or less. Suitable materials that may be used to form the dielectric layer 312 include silicon oxide or dioxide, diamond-like carbon, fluorinated silicate glass or fluorinated silicon oxide glass (FSG), $SiO_xC_y$, Spin-On-Glass, Spin-On-Polymers, silicon carbon material, compounds thereof, composites thereof, combinations thereof, or the like. The dielectric layer 312 may comprise a plurality of layers, including one or more etch stop layers.

The dielectric layer 312 may be formed by any suitable method known in the art. In an embodiment, the dielectric layer 312 comprises an oxide that may be formed by chemical vapor deposition (CVD) techniques using tetra-ethyl-ortho-silicate (TEOS) and oxygen as a precursor. The dielectric layer 312 is preferably about 200 Å to about 10,000 Å in thickness, but more preferably about 4000 to about 7000 Å in thickness. Other thicknesses and materials may be used.

An etch-stop layer 314 may be formed between the dielectric layer 312 and the substrate 310. The etch-stop layer 314 preferably comprises a material with a different chemical property from that of the dielectric layer 312 such that an etchant with a high-etch selectivity between the dielectric layer 312 and the etch-stop layer 314 may be used. For example, if the dielectric layer 312 is silicon oxide or a low permittivity (low-k) dielectric, the etch-stop layer 314 may comprise silicon nitride, silicon carbide, or the like. Other materials may be used.

An opening, such as a trench 320 and via 322, is formed in the dielectric layer 312 and etch-stop layer 314. The trench 320 and via 322 may be formed by photolithography techniques and single-/double-damascene processes known in the art. Generally, photolithography techniques involve applying a photoresist material (not shown) and exposing the photoresist material in accordance with a desired pattern. The photoresist material is then developed to remove a portion of the photoresist material, thereby exposing the underlying material in accordance with the desired pattern. The remaining photoresist material protects the underlying material from subsequent processing steps, such as etching, performed to form the trench 320 and via 322 in the dielectric layer 312 and etch-stop layer 314. The etching process may be a wet or dry, anisotropic or isotropic, etch process, but preferably is an anisotropic dry etch process. After the trench 320 and via 322 are formed in the dielectric layer 312 and etch-stop layer 314, the remaining photoresist, if any, may be removed. This process may be repeated with different masks for a dual-damascene process. Other processes, such as electron beam lithography (EBL) or the like, may be utilized to form the trench 320 and via 322.

It should be noted that FIG. 3 illustrates a dual-damascene process for illustrative purposes only. Other processes, such as a single-damascene process may be utilized in accordance with an embodiment of the present invention.

Figure 4:
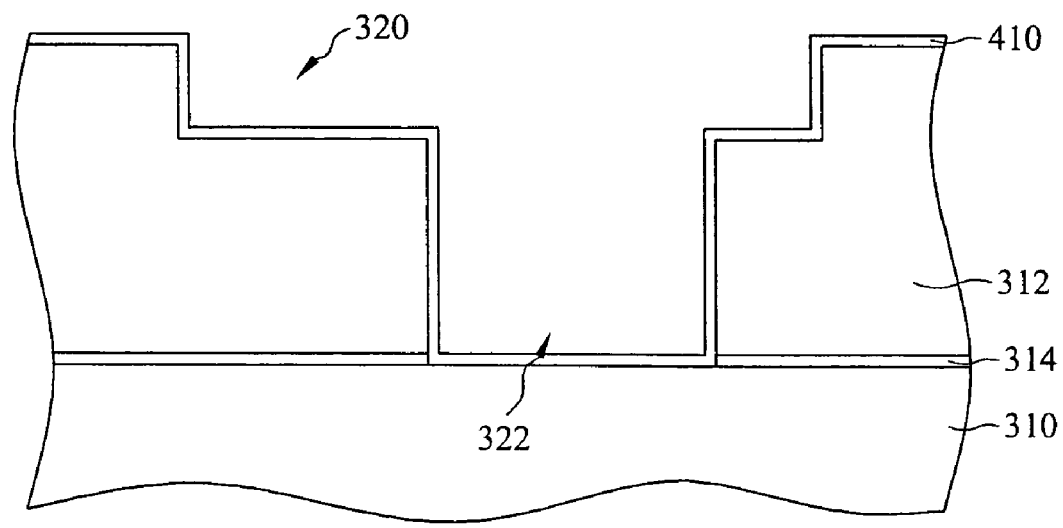

FIG. 4 illustrates the workpiece 300 after a barrier/adhesion layer 410 is formed along the surface in accordance with an embodiment of the present invention. The barrier/adhesion layer 410 may be formed of one or more adhesion layers and/or barrier layers of a conductive material, such as titanium, titanium nitride, tantalum, tantalum nitride, or the like. In an embodiment, the barrier/adhesion layer 410 is formed of a thin layer of tantalum nitride deposited by CVD techniques. In another embodiment, the barrier/adhesion layer 410 is formed of a thin layer of tantalum nitride and a thin layer of tantalum deposited by CVD techniques. The barrier/adhesion layer 410 is preferably about 5 Å to about 400 Å

Figure 5:
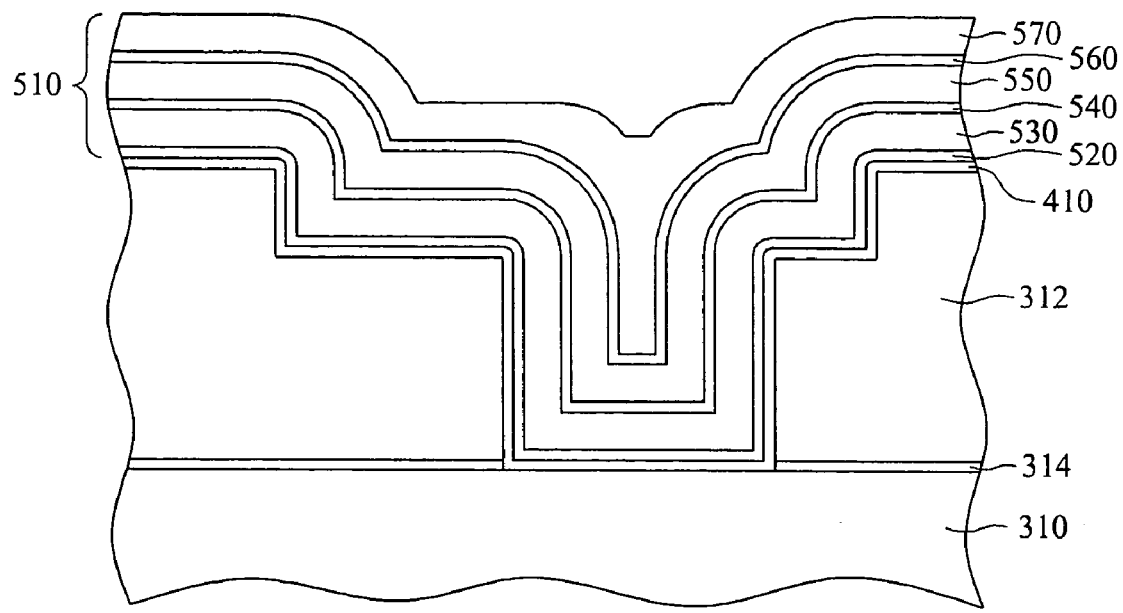

FIG. 5 illustrates the workpiece 300 of FIG. 4 after a conductive layer 510 has been formed to substantially fill the trench 320 and via 322 (FIG. 3) in accordance with an embodiment of the present invention. Preferably, the conductive layer 510 comprises a multi-layer structure having one or more layers exhibiting counteracting stress characteristics. For example, as discussed above, copper interconnects often exhibit a tensile stress that may cause the copper to pullback from the bottom of the via, creating a pullback void. In this situation, it is preferred that one or more layers of a material that exhibits a compressive stress be deposited to counteract the tensile stress of the copper interconnects. It has been found that in this manner, the pullback void problem discussed above may be prevented or reduced.

Referring back to FIG. 5, in an embodiment of the present invention that utilizes a copper interconnect, the conductive layer 510 may have a first copper layer 520, a second copper layer 530, a first stress-relief layer 540, a third copper layer 550, a second stress-relief layer 560, and a fourth copper layer 570. It should be noted that four copper layers and two stress-relief layers are shown for illustrative purposes only, and accordingly, different numbers and combinations of conductive layers and stress-relief layers, as well as different materials, may be used. The embodiment illustrated is used only to illustrate how one or more stress-relief layers may be incorporated into existing processes in a cost-effective manner.

Figure 7:
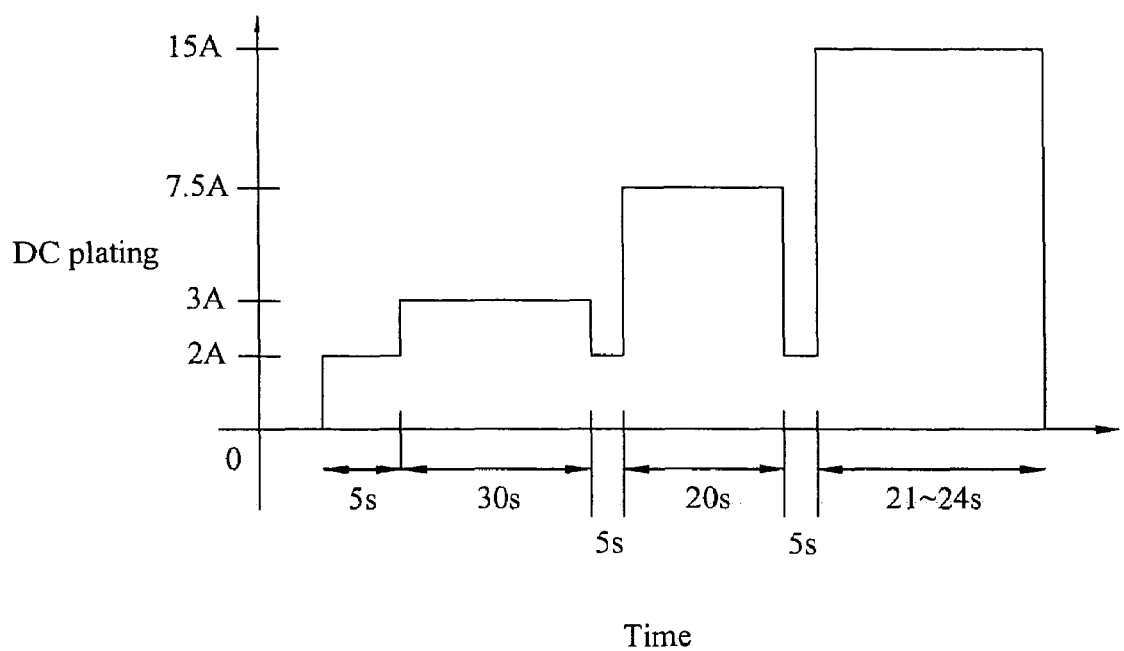
FIG. 7 is a plot illustrating DC voltages and time periods that may be used for electroplating an interconnect structure in accordance with an embodiment of the present invention.

In this embodiment, the conductive layer 510 may be formed by an electroplating process as illustrated in FIG. 7. As known in the art, electroplating involves submerging the workpiece 300 in a solution containing copper and applying a voltage differential. The current causes copper particles to be attracted to the workpiece, thereby plating the workpiece with a layer of copper. A copper seed layer (not shown) is typically deposited on the workpiece to begin the process.

In a typical electroplating procedure, the DC current is increased in stages as the copper layer becomes thicker. In accordance with embodiments of the present invention, the DC current is occasionally reduced to form a thin film of copper. It has been found that copper deposited at a lower DC current results in a copper layer having a larger grain size that is denser than copper layers deposited at higher DC currents. The copper layer having a larger grain size imports a compressive stress, thereby reducing or preventing pull-back voids. Preferably, the grain size of the first and second stress relief layers 540, 560 is greater than or equal to about 0.5 µm.

For example, as illustrated in FIG. 7 the DC current is increased in steps, starting at about 2 amps for about 5 seconds, depositing about 123 Å of copper for the first copper layer 520. Thereafter, the DC current may be increased to about 3 amps for about 30 seconds to deposit about 1000 Å of copper for the second copper layer 530. The first stress-relief layer 540 is formed by decreasing the DC current to about 2 amps for about 5 seconds to create a layer of copper. Preferably, the first stress-relief layer 540 is less than about 500 Å in thickness.

The DC current may be increased to about 7.5 amps for about 20 seconds to deposit about 1600 Å for the third copper layer 550. If desired, the DC current may be decreased to about 2 amps for about 5 seconds to form the second stress-relief layer 560. The fourth copper layer may be formed by increasing the DC current to about 15 amps for about 21 to about 24 seconds.

It should be noted that the DC currents, thickness, and times discussed above with reference to FIG. 7 are provided only as an example of an embodiment of the present invention. The actual currents, times, and thicknesses are dependent, among other things, upon the size of the device, the area being electroplated, the concentration of copper in the electroplating solution, and the like. In a preferred embodiment, however, the DC current used to form the first and second stress-relief layers 540, 560 is reduced to less than about 40 mA/cm$^2$.

In an alternative embodiment, the first stress-relief layer 540 and/or the second stress-relief layer 560 may be formed of a material other than electroplated copper. For example, the first stress-relief layer 540 and/or the second stress-relief layer 560 may be formed of a self-ionized plasma copper (SIP-Cu), tantalum, silicon carbide, or the like. In the situation in which an interconnect material having a tensile stress characteristic is used, such as copper, it is preferred that the material used for the stress relief layers exhibit a compressive stress to counteract the tensile stress of the copper material. Similarly, in the situation in which a material having a compressive stress characteristic is used, it is preferred that the material used for the stress relief layers exhibit a tensile stress to counteract the compressive stress of the interconnect material.

Figure 6:
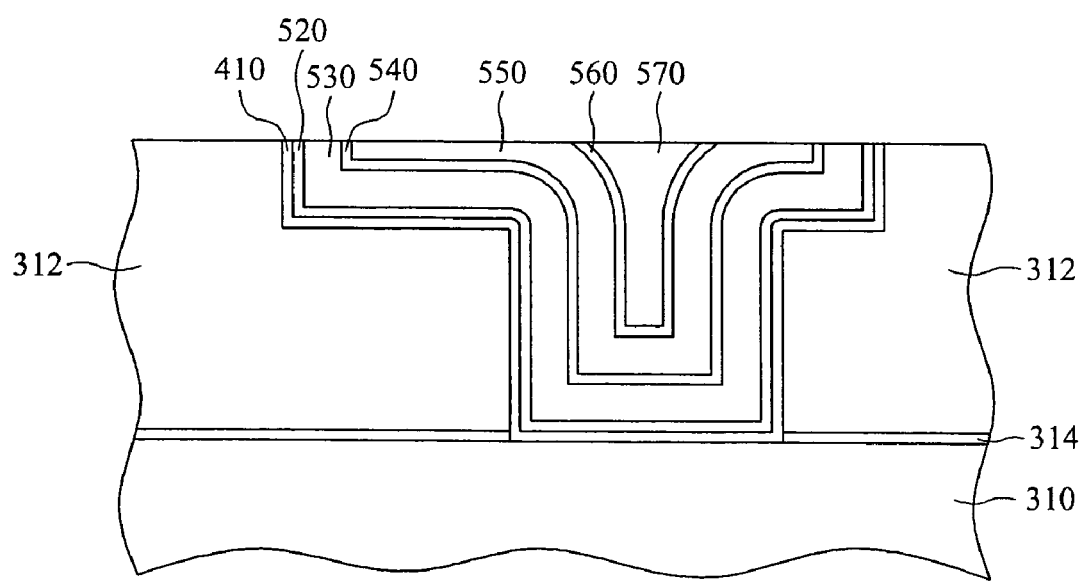

Referring now to FIG. 6, the workpiece 300 of FIG. 5 is shown after a planarization process has been performed in accordance with an embodiment of the present invention. The planarization process, such as a chemical-mechanical process (CMP), may be performed to planarize the surface and to remove excess deposits of the material used to form the barrier/adhesion layer 410 and the conductive layer 510. Optionally, a thermal anneal may be performed prior to or after the planarization process. Preferably, the thermal anneal is performed at a temperature of about 150° C. to about 250° C. for about 20 seconds to about 120 seconds in an ambient of $N_2$ and $H_2$ (5%) mixture. Thereafter, standard processes may be used to complete fabrication of the workpiece 300.

The embodiments of the invention described above are exemplary and not limiting, and variations that are apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an interconnect structure in a semiconductor device, the method comprising:
   providing a substrate, the substrate having a dielectric layer formed thereon;
   forming an opening in the dielectric layer;
   forming a plurality of conductive layers in the opening; and
   forming one or more stress-relief layers, each of the stress-relief layers being positioned between two of the plurality of conductive layers, the one or more stress-relief layers exerting a different type of stress than the plurality of conductive layers.

2. The method of claim 1, wherein the forming a plurality of conductive layers comprises forming a copper seed layer.

3. The method of claim 1, further comprising forming a barrier layer along a surface of the opening prior to the forming a plurality of conductive layers.

4. The method of claim 1, wherein the one or more stress-relief layers exhibit a stress characteristic opposite of one or more of the plurality of conductive layers.

5. The method of claim 1, wherein the one or more stress-relief layers comprise self-ionized plasma copper, tantalum, or silicon carbide.

6. The method of claim 1, wherein each of the one or more stress-relief layers is less than about 500 Å in thickness.

7. The method of claim 1, wherein the forming a plurality of conductive layers includes electroplating one or more copper layers.

8. The method of claim 7, wherein the forming one or more stress-relief layers includes electroplating a copper stress-relief layer at a lower current than a current used for the electroplating one or more copper layers.

9. A method of forming an interconnect structure in a semiconductor device, the method comprising:

provid a substrate, the substrate having a dielectric layer formed thereon;

forming an opening in the dielectric layer;

electroplating at least a first copper layer at a first current in the opening;

electroplating at least a first stress-relief layer at a second current on the first copper layer, the second current being less than the first current; and electroplating at least a second copper layer at a third current on the first stress-relief layer, the third current being greater than the first current and the second current.

10. The method of claim 9, wherein the electroplating at least a first copper layer includes forming a seed layer.

11. The method of claim 9, wherein the second current is less than about 40 mA/cm$^2$.

12. The method of claim 9, wherein the first stress-relief layer has a grain size greater than or equal to about 0.5 μm.

13. The method of claim 9, further comprising forming a barrier layer on a surface of the dielectric layer in the opening prior to the electroplating at least a first copper layer.

14. A method of forming an interconnect structure in a semiconductor device, the method comprising:

providing a substrate, the substrate having a dielectric layer formed thereon;

forming an opening in the dielectric layer;

forming a plurality of copper layers in the opening, the plurality of copper layers exerting a tensile stress; and forming one or more copper stress-relief layers, each of the copper stress-relief layers being positioned between two of the plurality of copper layers and each of the copper stress-relief layers having a grain size greater than or equal to about 0.5 μm, the one or more copper stress-relief layers exerting a compressive stress.

15. The method of claim 14, wherein the forming a plurality of copper layers includes forming a copper seed layer.

16. The method of claim 14, further comprising forming a barrier layer along a surface of the opening prior to the forming a plurality of copper layers.

17. The method of claim 14, wherein the forming one or more copper stress-relief layers includes electroplating a copper layer at a current less than about 40 mA/cm$^2$.

18. The method of claim 14, wherein at least one of the copper stress-relief layers is less than about 500 Å in thickness.

19. The method of claim 14, wherein the forming a plurality of copper layers includes electroplating one or more copper layers.

20. The method of claim 19, wherein the forming one or more copper stress-relief layers includes electroplating a copper stress-relief layer at a lower current than a current used for the electroplating one or more copper layers.

* * * * *